United States Patent [19]

Ando et al.

[11] Patent Number: 4,816,701

[45] Date of Patent: Mar. 28, 1989

[54] COMPARATOR CIRCUIT

[75] Inventors: Hideki Ando; Takeo Nakabayashi, both of Itami, Japan

[73] Assignee: Mitsubishi Denki Kabushiki Kaisha, Tokyo, Japan

[21] Appl. No.: 131,495

[22] Filed: Dec. 10, 1987

[30] Foreign Application Priority Data

Dec. 10, 1986 [JP] Japan ................................ 61-293713

[51] Int. Cl.$^4$ ............................................... H03K 5/24
[52] U.S. Cl. ..................................... 307/362; 307/355; 307/491
[58] Field of Search ................. 307/355, 356, 362, 491

[56] References Cited

U.S. PATENT DOCUMENTS

| 3,676,702 | 7/1972 | McGrogan, Jr. | 307/355 |
| 4,323,887 | 4/1982 | Buurma | 307/355 |
| 4,691,189 | 9/1987 | Dingwall et al. | 307/362 |

Primary Examiner—John Zazworsky
Attorney, Agent, or Firm—Sughrue, Mion, Zinn, Macpeak & Seas

[57] ABSTRACT

A comparator circuit for comparing an input signal Ein with a reference signal Vref. The comparator circuit includes an input circuit 1, a capacitor 4, first and second supply circuits 15,16, a voltage-stabilizing circuit 6, an output circuit 7 and control means $\phi$, $\bar{\phi}$. The input circuit selectively supplies either the input signal, or the reference signal to node 1N. The first supply circuit 15 supplies potential VDD to node 3N when the potential at node 2N is above a first voltage potential V1, and the second supply circuit supplies potential VDD to node 4N when the potential at the second node is above a second voltage potential V2. The voltage-stabilizing circuit 6 selectively connects the output terminal to a supply terminal, or a ground terminal. The output circuit includes an inverter circuit 2 and a switching circuit 3. The control means controls the comparator circuit so that during an equalizing period, the circuit produces a balance voltage Vbal, and during a sampling period, the circuit compares the input signal with the reference signal.

16 Claims, 3 Drawing Sheets

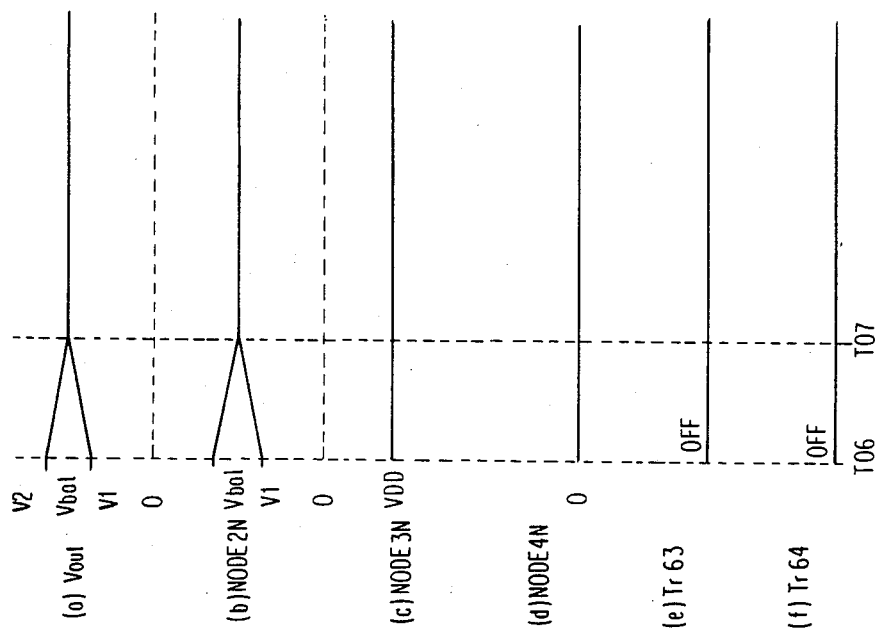
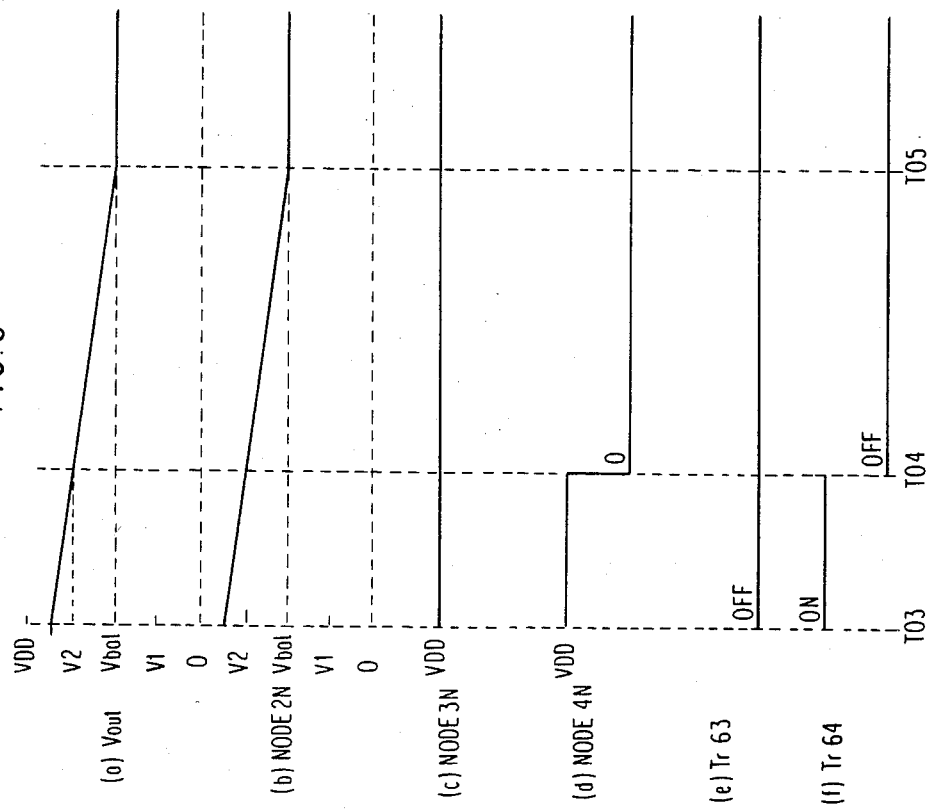

COMPARATOR CIRCUIT

BACKGROUND OF THE INVENTION

1. FIELD OF THE INVENTION

This invention relates in general to comparator circuits, and in particular, to a comparator circuit adapted for use in a metal-oxide-semiconductor (MOS) analog-to-digital (A/D) converter circuit.

2. DESCRIPTION OF THE PRIOR ART

The present invention is an improvement over the prior art comparator circuit disclosed in IEEE Journal of Solid-State Circuits, Vol. SC-14, No. 6, pgs. 926–932, Dec., 1979, entitled "Monolithic Expandable 6 Bit 20 MHZ CMOS/SOS A/D Converter" by Andrew G. F. Dingwall. The prior art circuit is shown in FIG. 1, and includes an input circuit 1, a capacitor 4, an inverter circuit 2 and a switching circuit 3.

The input circuit 1 is responsive to a control signal $\phi$, for selectively supplying either an input signal Ein, or a reference signal Vref, to node 1N. The input circuit 1 includes an input terminal 13, switching circuits 11 and 12, and a reference terminal 14. The input terminal 13 is adapted to receive the input signal Ein, and the reference terminal 14 is adapted to receive the reference signal Vref. The switching circuit 11 is connected between the input terminal 13 and node 1N, and includes a n-channel MOS transistor 111 connected in parallel with a p-channel MOS transistor 112. The switching circuit 12 is connected between the reference terminal 14 and node 1N, and includes a n-channel MOS transistor 121 connected in parallel with a p-channel MOS transistor 122. Each of the gate electrodes of MOS transistors 111 and 122 is adapted to receive the control signal $\phi$, and each of the gate electrodes of MOS transistors 112 and 121 is adapted to receive the complement $\overline{\phi}$ of the control signal.

If the control signal $\phi$ is "HIGH", for example, 5 volts, its complement e,ovs/$\overline{\phi}$/ is "LOW", such as 0 volts. When control signal $\phi$ is "HIGH", switching circuit 12 is non-conductive, and switching circuit 11 is conductive, thereby allowing only the input signal Ein to flow from input terminal 13 to node 1N through switching circuit 11. When the control signal $\phi$ is "LOW", the switching circuit 11 is non-conductive, and switching circuit 12 is conductive, thereby allowing only signal Vref to flow to node 1N. In this manner, circuit 1 can be controlled to selectively allow either input signal Ein, or reference signal Vref, to flow to node 1N.

The inverter circuit 2 is connected between node 2N and an output terminal 5, and includes a p-channel MOS transistor 21 connected in series with a n-channel MOS transistor 22. The source electrode of transistor 21 is connected to a supply potential terminal 23 which receives a supply voltage VDD, such as 5 volts. The source electrode of transistor 22 is connected to ground, and each of the gate electrodes of MOS transistors 21 and 22 is connected to node 2N.

Switching circuit 3 is connected between node 2N and the output terminal 5, and includes a n-channel MOS transistor 31 connected in parallel with a p-channel MOS transistor 32. The gate electrode of MOS transistor 32 is adapted to receive control signal $\phi$, and the gate electrode of n-channel transistor 31 is adapted to receive the complement e,ovs/$\overline{\phi}$/ of the control signal.

FIG. 2 shows a graph of the input-output characteristics of the inverter circuit 2. The graph contains a horizontal axis which indicates the input voltage of inverter circuit 2, a first vertical axis which indicates the output voltage of the inverter circuit 2, and a second vertical axis which indicates the penetrative current of the inverter circuit 2. The penetrative current is defined as that current which flows from supply potential terminal 23 to ground through transistors 21 and 22. In FIG. 2, a curved line S1 shows the relationship between the output voltage to the input voltage of the inverter circuit, and a curved line S3 shows the relationship of the penetrative current to the input voltage of the inverter circuit. The graph further includes a reference line S2 drawn from point zero (0) through point P. Point P on the graph represents the point where the input and output voltage of the inverter circuit 2 are each equal to a balance voltage Vbal.

The operation of the comparator circuit will now be described in detail below with reference to FIGS. 1 and 2.

Initially, control signal $\phi$ is "LOW", thereby causing switching circuit 11 to be non-conductive, and switching circuits 3 and 12 to be conductive. Switching circuit 3 acts to "equalize" the voltage between the input and output of inverter circuit 2. More specifically, since switching circuit 3 is conductive, the potential at node 2N is equal to the potential at the output terminal 5. In FIG. 2, the potential at node 2N, which is the input of inverter circuit 2, is equal to the potential at the output terminal 5, which is the output of inverter circuit 2, when the potentials at node 2N and at the output terminal 5 are each equal to voltage Vbal. Further, since switching circuit 12 is conductive, voltage signal Vref is applied to node 1N through switching circuit 12, and voltage signal Vbal is applied to node 2N as described above. As a result, capacitor 4, which is connected between nodes 1N and 2N, is charged up to a voltage equal to (Vref−Vbal).

Now that the voltage Vout at output terminal 5 is equal to Vbal, the logic state of the control signals are reversed for sampling the input voltage signal Ein. More specifically, control signal $\phi$ becomes "HIGH", and its complement e,ovs/$\overline{\phi}$/ becomes "LOW". Since control signal $\phi$ is "HIGH", switching circuit 11 becomes conductive, and switching circuits 3 and 12 each become non-conductive. As switching circuit 11 becomes conductive, input signal Ein flows from terminal 13 to node 1N through switching circuit 11. As a result, the voltage across capacitor 4 changes from (Vref−Vbal) to a voltage equal to (Ein−Vbal). If the input voltage Ein is higher than the reference voltage Vref, the change in the input voltage to the inverter 2 is positive, thereby causing the output voltage of inverter circuit 2 to drop to near 0 volts from the point P shown in FIG. 2. Alternatively, if the input voltage Vin is lower than the reference voltage Vref, the change of the input voltage to inverter circuit 2 is negative, thereby causing the output voltage of inverter circuit 2 to increase to voltage VDD from the point P shown in FIG. 2. In this manner, the comparator circuit of FIG. 1 can compare the input voltage Vin with the reference voltage Vref, and determine whether Vin is larger, (output of the inverter is 0) or smaller, (output of the inverter is VDD) than the reference voltage Vref.

As described in the IEEE Journal article referenced above, a high speed A/D converter can be constructed having sixty-four of the above prior art comparator circuits connected in parallel. In such an A/D converter, when switching circuit 3 is turned ON, input node 2N and output terminal 5 of the inverter 2 are connected electrically, resulting in each of the voltages at node 2N and at terminal 5 becoming equal to the balance voltage Vbal, as indicated by point P of FIG. 2. However, when switching circuit 3 is conductive, the p-channel MOS transistor 21 and the n-channel MOS transistor 22 of inverter circuit 2 are each ON, thereby causing the penetrative current of the inverter to be at a maximum as shown by curve S3 at point P. As a result, an A/D converter circuit constructed having a plurality of the prior art comparator circuits will consume a large amount of power at the time when the input and output of the inverter circuit 2 are each equal to balance voltage Vbal.

One solution to the above power consumption problem is to make the on-resistance of transistors 21 and 22 relatively large. By increasing the on-resistance of transistors 21 and 22, the penetrative current flowing through these transistors would be decreased. However, this solution introduces new problems into the A/D converter circuit since an increase in on-resistance of transistors 21 and 22 will decrease the driving capacity of the inverter circuit 2. More specifically, the present magnitude of the output voltage of the inverter circuit 2 of FIG. 1 is always relatively close to the balance voltage Vbal, thereby requiring only a minimal equalizing period for the output voltage to equal voltage Vbal. If the on-resistance of transistors 21 and 22 of the inverter circuit 2 is increased, the magnitude of the output voltage of the inverter will become relatively far from the balance voltage Vbal. Since the output voltage of the inverter circuit 2 is required to be equal to the balance voltage Vbal for comparing the input voltage Ein with the reference voltage Vref, the time period for equalizing the input and output voltages of the inverter 2 would be longer. In particular the equalizing time will be significantly longer when the output voltage of the inverter is far from the balance voltage Vbal. This longer equalizing time period necessarily lowers the operating speed of the circuit.

As is apparent from the problems associated with the comparator circuit of FIG. 1 (e.g. excessive power consumption and diminished operating speed), and more particularly, with an A/D converter circuit having a number of the comparator circuits, there remains a continuing need for an improved comparator circuit which consumes a relatively small amount of power, and which operates at a high rate of speed.

SUMMARY OF THE INVENTION

It is thus an object of the present invention is to provide an improved comparator circuit which consumes a relatively small amount of power, and which operates at a high rate of speed.

These and other objects of the invention are realized in the present comparator circuit which includes an input circuit, a capacitor, and an output circuit having an inverter and a switching circuit. The invention further includes a voltage-stabilizing circuit for selectively connecting a second node to each of a supply terminal and a ground terminal, a first potential supply circuit for supplying a supply potential to a third node when the voltage at the second node is above a first threshold potential, and a second potential supply circuit for supplying the supply potential to a fourth node when the voltage at the second node is above a second threshold potential.

BRIEF DESCRIPTION OF THE DRAWINGS

FIGS. 7 through 9 are wave form drawings representing the voltages at selected nodes, and the logic state of transistors 63 and 64 of the comparator circuit of FIG. 3.

DESCRIPTION OF THE PREFERRED EMBODIMENT

Figure 1:
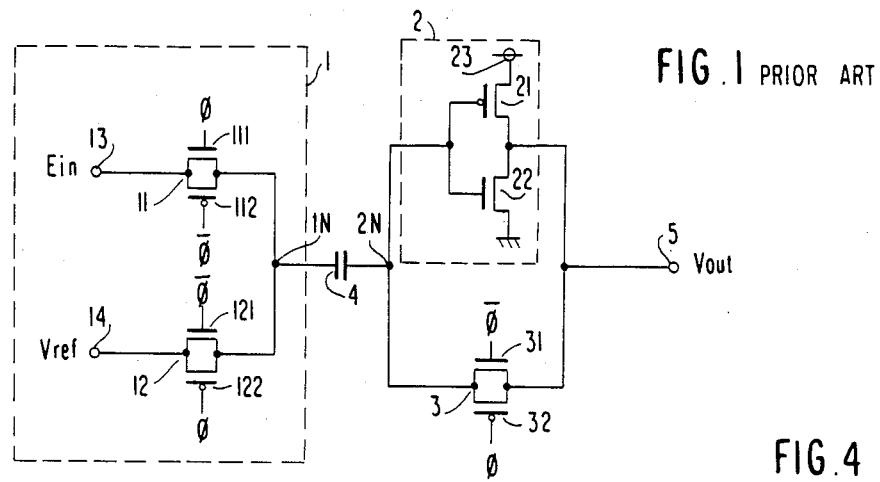
FIG. 1 is a circuit diagram of a prior art comparator circuit.
Figure 3:
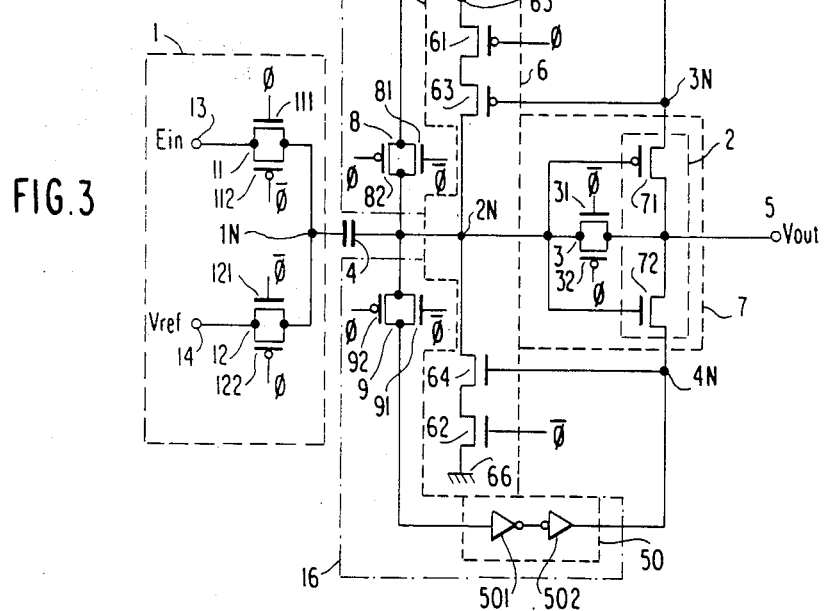
FIG. 3 is a circuit diagram of a comparator circuit in accordance with the present invention.

In FIG. 3, similar elements, signals and nodes of FIG. 1 are similarly numbered. FIG. 3 shows the comparator circuit of the present invention, and includes an input circuit 1, a voltage-stabilizing circuit 6, an output circuit 7 and potential supply circuits 15 and 16.

The output circuit 7 is connected between node 2N and output terminal 5, and includes an inverter circuit 2 and a switching circuit 3. The inverter circuit 2 contains a p-channel MOS transistor 71 connected in series with a n-channel MOS transistor 72. MOS transistor 71 is connected between node 3N and the output terminal 5, and MOS transistor 72 is connected between node 4N and the output terminal 5. Each of the gate electrodes of MOS transistors 71 and 72 is connected to node 2N. The switching circuit 3 is connected between node 2N and the output terminal 5, and includes a n-channel MOS transistor 31 connected in parallel with a p-channel MOS transistor 32. The gate electrode of MOS transistor 32 is adapted to receive the control signal $\phi$, and the gate electrode of MOS transistor 31 is adapted to receive the complement e,ovs/$\overline{\phi}$/ of the control signal.

The voltage-stabilizing circuit 6 includes MOS transistors 61, 63, 64 and 62 connected in series between terminals 65 and 66. Terminal 65 is adapted to receive supply potential VDD, and terminal 66 is connected to ground. Transistor 61 is a p-channel MOS transistor, and is connected between terminal 65 and transistor 63. The gate electrode of transistor 61 is adapted to receive the control signal $\phi$. Transistor 63 is a p-channel MOS transistor, and is connected between transistor 61 and node 2N. The gate electrode of MOS transistor 63 is connected to node 3N. Transistor 62 is a n-channel MOS transistor, and is connected between ground terminal 66 and transistor 64. The gate electrode of transistor 62 is adapted to receive the complement e,ovs/$\overline{\phi}$/ of the control signal. Transistor 64 is a n-channel MOS transistor, and is connected between node 2N and transistor 62. The gate electrode of transistor 64 is connected to node 4N.

The voltage-stabilizing circuit 6 is operable for connecting node 2N to the supply potential terminal 65 through MOS transistors 61 and 63 when the control signal $\phi$ is "LOW" and the potential at the output terminal 5 is lower than threshold potential V1 which has a potential between ground and the balance potential Vbal of the output circuit 7. The voltage-stabilizing circuit is also operable for connecting node 2N to ground terminal 66 through MOS transistors 64 and 62 when the control signal φ is "LOW" and the potential at the output terminal 5 is higher than threshold potential V2 which has a potential between potential VDD and the balance potential Vbal. The on-resistance of MOS transistors 71 and 72 are sufficiently larger than that of MOS transistors 61, 62, 63 and 64 to allow for the output voltage at terminal 5 to increase when transistor 72 is ON and terminal 5 is connected to terminal 65 through transistors 61 and 63, or decrease when transistor 71 is ON and terminal 5 is connected to terminal 66 through transistors 64 and 62, as will be explained in more detail in connection with the operation of the circuit of FIG. 3.

Figure 4:
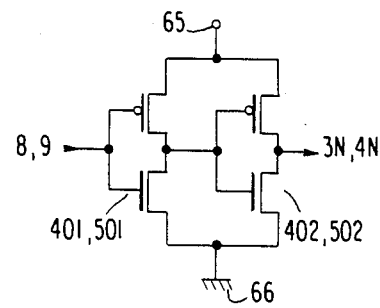
FIG. 4 is a circuit diagram showing a buffer circuit of FIG. 3.
Figure 5:
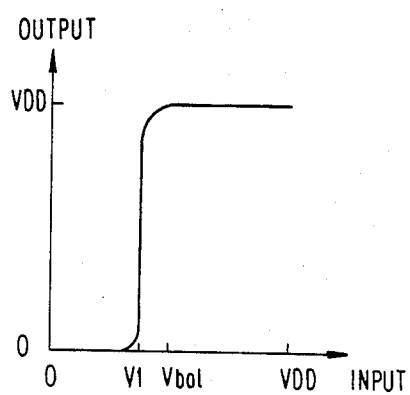
FIG. 5 is a graph of the input-output characteristics of a first buffer circuit of FIG. 3.

The potential supply circuit 15 is operable for supplying voltage VDD to node 3N when control signal φ is "LOW", and the potential at the output terminal 5 or node 2N is higher than the threshold voltage V1. The potential supply circuit 15 includes a switching circuit 8 and a buffer circuit 40. The switching circuit 8 contains a n-channel MOS transistor 81 connected in parallel with a p-channel MOS transistor 82. The gate electrode of transistor 82 is adapted to receive the control signal φ, and the gate electrode of transistor 81 is adapted to receive the complement e,ovs/φ̄/ of the control signal. The buffer circuit 40 is connected between switching circuit 8 and node 3N, and includes two CMOS inverters 401 and 402 as shown in FIGS. 3 and 4. The buffer circuit 40 is operable for supplying potential VDD to node 3N when control signal φ is "LOW" and the potential at node 2N is above threshold voltage V1. In FIG. 5, there is shown a graph representing the relationship between the input and output voltages of buffer circuit 40. When the input voltage (at node 2N) is below the threshold voltage V1, the output voltage of buffer circuit 40 (at node 3N) is 0 volts. When the input voltage is above threshold voltage V1, the output voltage of buffer circuit 40 is supply potential VDD.

The potential supply circuit 16 is operable for supplying potential VDD to node 4N when control signal φ is "LOW", and the voltage at node 2N is above threshold voltage V2. Supply circuit 16 includes a switching circuit 9 and a buffer circuit 50. The switching circuit 9 contains a n-channel MOS transistor 91 connected in parallel with a p-channel MOS transistor 92. The gate electrode of MOS transistor 92 is adapted to receive the control signal φ, and the gate electrode of transistor 91 is adapted to receive the complement e,ovs/φ̄/ of the control signal. The buffer circuit 50 is connected between switching circuit 9 and node 4N, and includes two CMOS inverters 501 and 502, as shown in FIGS. 3 and 4.

Figure 6:
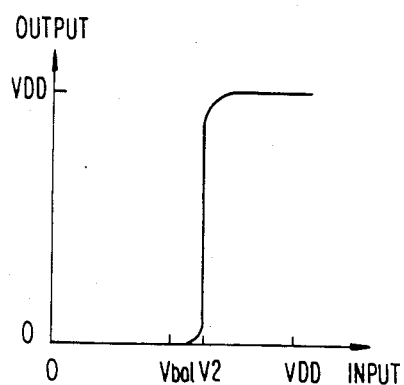
FIG. 6 is a graph of the input-output characteristics of a second buffer circuit of FIG. 3.

FIG. 6 shows a graph representing the relationship between the input and output voltages of buffer circuit 50. When the input voltage (at node 2N) to buffer circuit 50 is below threshold voltage V2, the output voltage (at node 4N) is 0 volts. When the input voltage to buffer circuit 50 is above threshold voltage V2, the output voltage of circuit 50 is potential VDD.

The operation of the chopper type comparator circuit of the present invention will now be described in detail below with reference to the wave form diagrams of FIGS. 7 through 9. More specifically, FIG. 7 shows the situation when Vout is below V1, FIG. 8 shows when Vout is above V2, and FIG. 9 shows when Vout is between V1 and V2.

The operation of the comparator circuit of FIG. 3 is similar to the circuit of FIG. 1 in that both circuits compare the input signal Ein with the reference signal Vref, to determine if Ein is greater, or smaller, than Vref. However, the comparator circuit of FIG. 3 has a high operating speed, yet minimizes the penetrative current through transistors 71 and 72 when Vout is equal to the balance voltage Vbal.

Figure 7:
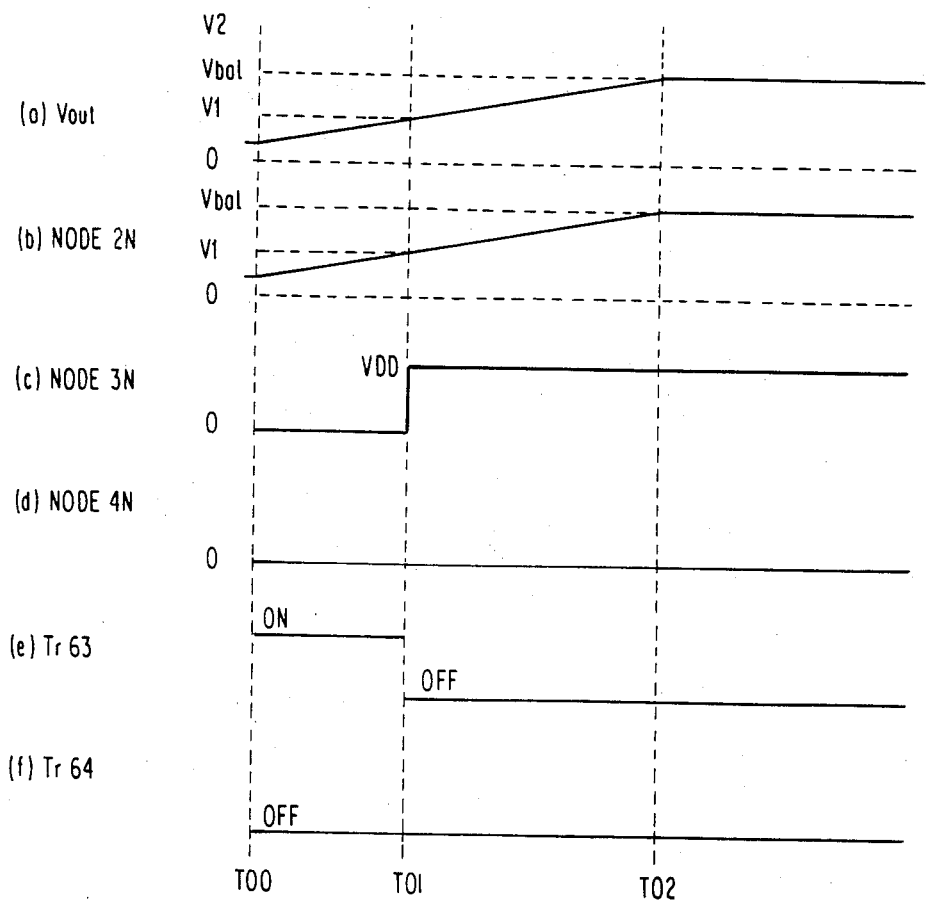

During the time period between T00 and T01 of FIG. 7, the voltage range of the output signal Vout at terminal 5 is between 0 volts and the threshold potential V1 of buffer circuit 40. Since control signal φ is "LOW", switching circuit 11 is non-conductive, switching circuits 3, 8, 9 and 12 are conductive, and MOS transistors 61 and 62 are each ON. During this time period, the outputs of buffer circuits 40 and 50, nodes 3N and 4N, respectively, are each equal to 0 volts since the voltage at node 2N (FIG. 7(b)) is less than the threshold voltage V1. Further, p-channel MOS transistor 63, which has its gate electrode connected to node 3N, is ON (FIG. 7(e)), and n-channel MOS transistor 64, which has its gate electrode connected to node 4N, is OFF (FIG. 7(f)). Since the potential at node 3N is equal to 0 volts, the output terminal 5 is connected to terminal 65 (VDD) through MOS transistors 61 and 63 and switching circuit 3. As a result, during the time period between T00 and T01, the output voltage Vout at the output terminal 5 (and at node 2N) increases. As Vout increases above a threshold voltage Vth of transistor 72, transistor 72 turns ON, causing output terminal 5 to become connected to ground (node 4N) through MOS transistor 72. Although output terminal 5 is connected to ground when voltage Vout increases above Vth, the Vout continues to increase at a high rate of speed, as shown in FIG. 7(a). Output voltage Vout continues to increase because the on-resistance of MOS transistors 61 and 63 is sufficiently smaller than that of transistor 72.

As voltage Vout increases to more than the threshold voltage V1, corresponding to the time after T01, the output (node 3N) of buffer circuit 40 becomes potential VDD since the input (node 2N) to buffer circuit 40 is above threshold voltage V1. As the voltage at node 3N increases to potential VDD, p-channel MOS transistor 63, which has its gate electrode connected to node 3N, turns OFF (FIG. 7(E)). Since the output (node 4N) of the second buffer circuit 50 continues to equal 0 volts, transistor 64 remains OFF, and voltage-stabilizing circuit 6 becomes disabled as transistors 63 and 64 are each OFF. Thus, the voltage-stabilizing circuit 6 is operable when the voltage Vout is less than V1, and more specifically, acts to increase Vout to voltage V1, at a high rate of speed, whenever Vout drops below voltage V1.

Turning now to the time period between T01 and T02 of FIG. 7, voltage-stabilizing circuit 6 is disabled as transistors 63 and 64 remain OFF, and the output circuit 7 acts to increase voltage Vout from V1 to Vbal. Since the source electrode of transistor 71 receives potential VDD, and switching circuit 3 is conductive, the comparator circuit of FIG. 3 acts like the circuit of FIG. 1. More specifically, inverter circuit 7 is shorted by switching circuit 3, and switching circuit 3 acts to equalize the voltages at node 2N and at the output terminal 5 to voltage Vbal, as described in connection with FIG. 1.

In FIG. 8, between time T03 and T04, the range of the output voltage Vout is shown to be between the threshold voltage V2 of buffer circuit 50 and potential VDD. As shown in FIGS. 8(c) and 8(D), each of the outputs (nodes 3N and 4N) of buffer circuits 40 and 50 is equal to potential VDD, since the potential at node 2N is larger than the threshold voltage V2. This causes p-channel transistor 63, which has its gate electrode connected to node 3N, to turn OFF, as shown in FIG. 8(e), and n-channel transistor 64, which has its gate electrode connected to node 4N, to turn ON, as shown in FIG. 8(f). As a result, the output terminal 5 is connected to ground terminal 66 through switching circuit 3 and transistors 64 and 62, causing Vout to decrease as shown in FIG. 8(a). When potential Vout becomes smaller than the voltage (VDD−Vth), where Vth is the absolute value of the threshold voltage of transistor 71, transistor 71 turns ON. As transistor 71 turns ON, output terminal 5 becomes connected to potential VDD through transistor 71 and buffer circuit 40, since the output of buffer circuit 40 is potential VDD (node 3N). However, since the on-resistance of transistors 62 and 64 is sufficiently smaller than that of transistor 71, Vout continues to decrease, at a high rate of speed, as shown in FIG. 8(a). As voltage Vout drops below threshold voltage V2 of buffer circuit 50, corresponding to the time after T04, the output voltage of buffer circuit 50 (at node 4N) becomes equal to 0 volts. Because the input of buffer circuit 50 receives potential Vout through switching circuits 3 and 9, which is smaller than threshold voltage V2, the potential at node 4N becomes equal to 0 volts, as shown in FIG. 8(d), and transistor 64 turns OFF. As the output of buffer circuit 40 maintains potential VDD, transistor 63 remains OFF. Since transistors 63 and 64 are each OFF, voltage-stabilizing circuit 6 becomes disabled. Thus, voltage-stabilizing circuit 6 also becomes operable when Vout becomes larger than voltage V2, and more specifically, acts to decrease Vout to voltage V2, at a high rate of speed, whenever Vout increases above V2.

Referring now to the time period between T04 and T05 of FIG. 8, where the potential Vout decreases from voltage V2 to the balance potential Vbal. During this time period, voltage-stabilizing circuit 6 is disabled, and the voltage at node 3N is equal to potential VDD. Accordingly, the circuit of FIG. 3 acts like the circuit of FIG. 1 to equalize the input and output voltages of inverter circuit 2 to voltage Vbal.

In FIG. 9, the range of the output voltage Vout is shown to be between voltage V1 and V2, corresponding to the time period between T06 and T07. During this period, the output of buffer circuit 40 is potential VDD, as shown in FIG. 9(c), since the voltage at node 2N is greater than threshold voltage V1. Further, the output of buffer circuit 50 is equal to 0 volts, as shown in FIG. 9(d), since the voltage at node 2N is smaller than threshold voltage V2. As a result, p-channel transistor 63, which has its gate electrode connected to node 3N, turns OFF, and n-channel transistor 64, which has its gate electrode connected to node 4N, turns OFF. Since transistors 63 and 64 are each OFF, the voltage-stabilizing circuit 6 becomes disabled, and the output circuit 7 acts to increase or decrease Vout to the balance potential Vbal as shown in FIG. 9(a) at time T07.

Figure 2:
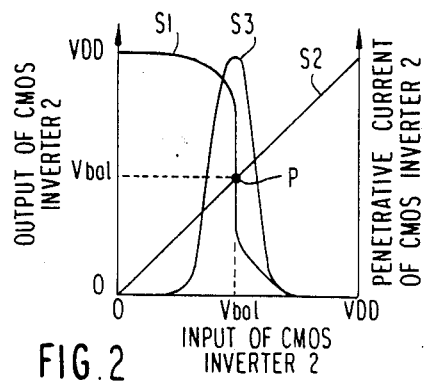
FIG. 2 is a graph of the input-output characteristics of the inverter circuit of FIG. 1.

The description of the operation of the circuit of FIG. 3 will now relate to the period in which the input and output voltages of the inverter circuit are each equal to the balance voltage Vbal. More specifically, when the input and output voltages of inverter circuit 2 are each equal to Vbal, the input signal Ein can be compared with the reference signal Vref. As indicated above, the on-resistance of transistors 71 and 72 were made higher than transistors 61, 63, 64 and 62. The increase in on-resistance of transistors 71 and 72 has the effect of decreasing the penetrative current which flows through transistors 71 and 72. More specifically, when the input and output of the inverter circuit 7 are each equal to voltage Vbal, the penetrative current is decreased from its maximum value, as indicated in the graph of FIG. 2, thereby decreasing the power requirements of the circuit.

In this period, the control signal φ becomes "HIGH", thereby causing switching circuit 11 to become conductive, switching circuits 13, 8, 9 and 12 to become nonconductive, and transistors 61 and 62 to turn OFF. Accordingly, the comparator can now sample the input voltage Ein which is applied to node 1N through switching circuit 11. Since transistors 61 and 62 are each OFF, voltage-stabilizing circuit 6 is disabled, and since control signal φ is "HIGH", switching circuit 3 is nonconductive, and the output circuit 7 behaves like the inverter circuit 2. When the input signal Ein is higher than the reference voltage Vref, the change of the input voltage to the output circuit 7 is positive, and Vout decreases to 0 volts. When the input Ein is lower than the reference voltage Vref, the change of the input voltage to the output circuit 7 is negative, and Vout increases to potential VDD. In this manner, the comparator circuit of FIG. 3 can compare the input voltage Ein with the reference voltage Vref, and determine whether Ein is larger, or smaller, than Vref.

Although the above description relates to a particular embodiment of the present invention, it will be apparent to those skilled in the art that modifications may be made without departing from the invention. For example, although buffer circuits 40 and 50 have been described as having two inverters as shown in FIG. 4, any circuit having the characteristics shown in FIG. 5 and FIG. 6 may be used. In addition, although the comparator circuit of the invention has been described as having both p-channel and n-channel MOS transistors, those skilled in the art will understand that the transistors of the circuit can be either all n-channel MOS transistors or all p-channel MOS transistors.

It should be understood that the invention is limited only by the following claims

We claim:
1. A comparator circuit for comparing an input signal with a reference signal, comprising:
an output terminal;
first, second, third and fourth nodes;
input means coupled to the first node, for supplying one of the input signal and the reference signal to the first node;
electrical means, coupled between the first and second nodes, for electrically connecting said input means to the second node;
first means, coupled to said second and third nodes, for supplying a supply potential to the third node when the second node is above a first threshold potential;
second means, coupled to the second and fourth nodes, for supplying the supply potential to the fourth node when the second node is above a second threshold potential;
voltage-stabilizing means, coupled to the second node, for connecting the second node to the supply potential when the output terminal is below the first threshold potential, and for connecting the second node to a ground potential when the output terminal is above the second threshold potential;

an output circuit comprising an inverter circuit connected between the third and fourth nodes, and means, coupled between the second node and the output terminal, for connecting the second node to the output terminal, said inverter circuit having a higher on-resistance than said voltage stabilizing means; and control means, coupled to said input means, said first and second means, said voltage-stabilizing means and said connecting means, for supplying control signals thereto.

2. The comparator circuit of claim 1, wherein said input means comprises: an input terminal for receiving the input signal, a first switching circuit connected between said input terminal and the first node, a reference terminal for receiving the reference signal, and a second switching circuit connected between the reference terminal and the first node.

3. The comparator circuit of claim 1, wherein said first means comprises a switching circuit connected to the second node, and a buffer circuit connected between said switching circuit and the third node.

4. The comparator circuit of claim 1, wherein said second means comprises a switching circuit connected to the second node and a buffer circuit connected between said switching circuit and the fourth node.

5. The comparator circuit of claim 1, wherein said voltage-stabilizing means comprises a first terminal for receiving the supply potential, a second terminal connected to a ground potential, and a plurality of MOS transistors connected in series between said first and second terminals.

6. The comparator circuit of claim 1, wherein said connecting means of said output circuit comprises a switching circuit.

7. The comparator circuit of claim 1, where said first threshold voltage is lower than said second threshold voltage.

8. The comparator circuit of claim 1, wherein said voltage-stabilizing means is operable when the output terminal is below the first threshold voltage and above the second threshold voltage.

9. The comparator circuit of claim 1, wherein said electrical means comprises a capacitor.

10. The comparator circuit of claim 2, wherein said first and second switching circuits each includes a p-channel MOS transistor connected in parallel with a n-channel MOS transistor.

11. The comparator circuit of claim 3, wherein said switching circuit includes a p-channel MOS transistor connected in parallel with a n-channel MOS transistor.

12. The comparator circuit of claim 3, wherein said buffer circuit comprises two CMOS inverters connected in series.

13. The comparator circuit of claim 4, wherein said buffer circuit comprises two CMOS inverters connected in series.

14. The comparator circuit of claim 4, wherein said switching circuit includes a p-channel MOS transistor connected in parallel with a n-channel MOS transistor.

15. The comparator circuit of claim 5, wherein said plurality of MOS transistors includes four MOS transistors, two of said four transistors being p-channel MOS transistors connected in series between said first terminal and the second node, and two of said four transistors being n-channel MOS transistors connected in series between said second terminal and the second node.

16. The comparator circuit of claim 6, wherein said switching circuit includes a p-channel MOS transistor connected in parallel with a n-channel MOS transistor.

* * * * *